United States Patent
Song

(10) Patent No.: US 11,774,515 B2
(45) Date of Patent: Oct. 3, 2023

(54) APPARATUS AND METHOD FOR DETERMINING ERROR OF A BATTERY CELL

(71) Applicant: LG Energy Solution, Ltd., Seoul (KR)

(72) Inventor: Hyeon Jin Song, Daejeon (KR)

(73) Assignee: LG Energy Solution, Ltd.

( * ) Notice: Subject to any disclaimer, the term of this patent is extended or adjusted under 35 U.S.C. 154(b) by 199 days.

(21) Appl. No.: 17/420,203

(22) PCT Filed: Jan. 21, 2020

(86) PCT No.: PCT/KR2020/001039
§ 371 (c)(1),
(2) Date: Jul. 1, 2021

(87) PCT Pub. No.: WO2020/166840
PCT Pub. Date: Aug. 20, 2020

(65) Prior Publication Data
US 2022/0065944 A1    Mar. 3, 2022

(30) Foreign Application Priority Data

Feb. 14, 2019 (KR) .......... 10-2019-0017277

(51) Int. Cl.
*G01R 31/396* (2019.01)
*G01R 31/389* (2019.01)
(Continued)

(52) U.S. Cl.
CPC .......... *G01R 31/396* (2019.01); *B60L 3/0046* (2013.01); *B60L 58/12* (2019.02); *B60L 58/16* (2019.02); *G01R 31/389* (2019.01); *G01R 31/3842* (2019.01); *G01R 31/392* (2019.01); *H02J 7/0013* (2013.01);
(Continued)

(58) Field of Classification Search
None
See application file for complete search history.

(56) References Cited

U.S. PATENT DOCUMENTS 9,395,418 B2   7/2016   Rahaman et al.
2002/0109506 A1   8/2002   Kawakami et al.
(Continued)

FOREIGN PATENT DOCUMENTS

CN   105006864 A   10/2015
JP   H11329512 A   11/1999
(Continued)

OTHER PUBLICATIONS

Extended European Search Report including Written Opinion for Application No. 20756083.0 dated Mar. 2, 2022, pp. 1-6.
(Continued)

*Primary Examiner* — Jas A Sanghera
(74) *Attorney, Agent, or Firm* — Lerner David LLP

(57) ABSTRACT

A battery cell error determining apparatus including: a magnetic field measurement unit configured to measure a magnetic field generated by a current flowing in a battery cell, and a control unit configured to calculate a capacity of the battery cell by using a current calculated by the magnetic field measured by the magnetic field measurement unit. The control unit determines an error of the battery cell by using the capacity of the battery cell.

20 Claims, 12 Drawing Sheets

(51) Int. Cl.
*G01R 31/392* (2019.01)
*G01R 31/3842* (2019.01)
*B60L 58/12* (2019.01)
*B60L 58/16* (2019.01)
*H02J 7/00* (2006.01)
*B60L 3/00* (2019.01)

(52) U.S. Cl.
CPC ....... *H02J 7/0049* (2020.01); *B60L 2240/547* (2013.01); *B60L 2240/549* (2013.01)

(56) References Cited

U.S. PATENT DOCUMENTS

| | | |
|---|---|---|
| 2003/0006735 A1 | 1/2003 | Kawakami et al. |
| 2004/0138836 A1* | 7/2004 | Ishishita ............... G01R 15/202 |
| | | 702/63 |
| 2005/0035743 A1 | 2/2005 | Kawakami et al. |
| 2007/0120554 A1 | 5/2007 | Kawakami et al. |
| 2010/0066350 A1* | 3/2010 | Matsumura .......... G01R 15/207 |
| | | 324/120 |
| 2012/0112685 A1* | 5/2012 | Hartley ................. B60L 3/0046 |
| | | 320/106 |
| 2012/0306450 A1 | 12/2012 | Nakayama et al. |
| 2013/0090872 A1* | 4/2013 | Kurimoto ............... B60L 58/13 |
| | | 702/63 |
| 2013/0271072 A1 | 10/2013 | Lee et al. |
| 2014/0081141 A1 | 3/2014 | Nishihara et al. |
| 2014/0103934 A1 | 4/2014 | Matsui et al. |
| 2015/0070024 A1 | 3/2015 | Kim et al. |
| 2015/0293183 A1 | 10/2015 | Tenmyo et al. |
| 2016/0214500 A1 | 7/2016 | Kim et al. |
| 2018/0226695 A1 | 8/2018 | Miyaki et al. |
| 2021/0367277 A1* | 11/2021 | Takechi ............... H01M 10/482 |

FOREIGN PATENT DOCUMENTS

| | | |
|---|---|---|
| JP | 2004152755 A | 5/2004 |
| JP | 2008292403 A | 12/2008 |
| JP | 2010127858 A | 6/2010 |
| JP | 2010217070 A | 9/2010 |
| JP | 2011257411 A | 12/2011 |
| JP | 2012247339 A | 12/2012 |
| JP | 5167521 B2 | 3/2013 |
| JP | 2015026478 A | 2/2015 |
| JP | 2015027223 A | 2/2015 |
| JP | 2015052590 A | 3/2015 |
| JP | 2016024170 A | 2/2016 |
| JP | 6147668 B2 | 6/2017 |
| JP | 2018068081 A | 4/2018 |
| JP | 2018073777 A | 5/2018 |
| KR | 20050121184 A | 12/2005 |
| KR | 20150029204 A | 3/2015 |
| KR | 20160051327 A | 5/2016 |
| KR | 20160090645 A | 8/2016 |
| KR | 101738601 B1 | 5/2017 |
| KR | 101750478 B1 | 6/2017 |
| KR | 20170062764 A | 6/2017 |
| KR | 20180013576 A | 2/2018 |
| WO | 2012160976 A1 | 11/2012 |
| WO | 2017013823 A1 | 1/2017 |

OTHER PUBLICATIONS

International Search Report for Application No. PCT/KR2020/001039 dated May 1, 2020, pp. 1-3.

* cited by examiner

APPARATUS AND METHOD FOR DETERMINING ERROR OF A BATTERY CELL

CROSS-REFERENCE TO RELATED APPLICATIONS

The present application is a national phase entry under 35 U.S.C. § 371 of International Application No. PCT/KR2020/001039 filed Jan. 21, 2020, published in Korean, which claims priority from Korean Patent Application No. 10-2019-0017277, filed on Feb. 14, 2019, all of which are incorporated herein by reference.

TECHNICAL FIELD

The present invention relates to a battery cell error determining apparatus and method.

BACKGROUND ART

Recently, research and development on secondary batteries have been actively conducted. Here, the secondary batteries, as batteries that can be charged and discharged, mean that they include conventional Ni/Cd batteries and Ni/MH batteries, and recent lithium ion batteries. Among the secondary batteries, the lithium ion battery has an advantage that the energy density is much higher than that of the conventional Ni/Cd battery and Ni/MH battery, and further, the lithium ion battery can be manufactured with a tendency of a small size so that it is used as a power source for a mobile apparatus. In addition, the usage range of the lithium ion battery extends as a power source for electric vehicles, so that the lithium ion battery attracts attention as a next generation energy storage medium.

In addition, a secondary battery is generally used as a battery pack including a battery module in which a plurality of battery cells are connected in series and/or in parallel. And, a state and an operation of a battery pack are managed and controlled by a battery management system (BMS).

Here, in applications such as electric vehicles and energy storage systems (ESSs), a large number of battery cells are connected in series to secure high voltages. Then, in a battery pack that includes a large number of battery cells, a single current sensor is used to measure charge and discharge current.

In this case, since the deterioration degree of the battery is calculated through the capacity or the internal resistance of the entire battery pack, it is not possible to determine the capacity or the other internal errors of the specific battery cell.

In addition, when determining the capacity and degeneration of the battery pack, it is not measured in units of battery cells so that the error is large.

SUMMARY

Technical Problem

An object of the present invention is to accurately measure the capacity and voltage of the battery cell without deterioration by measuring the capacity and voltage.

Technical Solution

A battery cell error determining apparatus according to an embodiment of the present invention includes: a magnetic field measurement unit configured to measure a magnetic field generated by a current flowing in a battery cell; and a control unit configured to calculate a capacity of the battery cell based on an amount of current derived from the magnetic field measured by the magnetic field measurement unit; and determine an error of the battery cell based on the capacity of the battery cell.

The battery cell error determining apparatus according to an embodiment of the present invention further includes a magnetic field shield unit adapted to collect the magnetic field generated by the current flowing in the battery cell.

The battery cell error determining apparatus according to an embodiment of the present invention further includes a storage unit configured to store a battery capacity at a time of production of the battery cell.

In the battery cell error determining apparatus according to an embodiment of the present invention, the control unit is configured to derive the amount of current over a first duration; and calculate the capacity of the battery cell based on an accumulated amount of current over the first duration.

In the battery cell error determining apparatus according to an embodiment of the present invention, when a difference between the calculated capacity of the battery cell and the battery capacity at the time of production of the battery cell exceeds a preset threshold, the control unit is configured to determine that the battery cell has a deteriorated capacity.

The battery cell error determining apparatus according to an embodiment of the present invention further includes a voltage measurement unit configured to measure a voltage of the battery cell, wherein the storage unit is further configured to store a full charge/discharge time at the time of production of the battery cell, wherein the control unit is configured to calculate a full charge/discharge reach time of the battery cell based on the voltage of the battery cell, wherein, when a difference between calculated full charge/discharge reach time of the battery cell and the full charge/discharge reach time at the time of production of the battery cell exceeds a preset threshold, the control unit is configured to determine that an internal resistance of the battery cell is increased.

In the battery cell error determining apparatus according to an embodiment of the present invention, the magnetic field measurement unit and the magnetic field shield unit are positioned at any one of a negative electrode and a positive electrode of the battery cell.

In the battery cell error determining apparatus according to an embodiment of the present invention, the battery cell is included in an energy storage device or energy storage system (ESS) or a vehicle battery cell.

A battery pack according to another embodiment of the present invention includes: a plurality of battery cells connected in series; and a respective battery cell error determining apparatus included in each battery cell, wherein, for each given battery cell, the battery cell error determining apparatus included therein includes a current measurement unit configured to measure a current flowing through the battery cell and a control unit configured to calculate a capacity of the battery cell based on the current, wherein the control unit is configured to determine an error of the battery cell based on the capacity of the battery cell.

In the battery pack according to another embodiment of the present invention, the current measuring unit is configured to measure the current flowing in the battery cell based on a magnetic field generated by the current flowing in the battery cell.

In the battery pack according to another embodiment of the present invention, the battery cell error determining apparatus further includes a storage unit configured to store a battery capacity at a time of production of the battery cell.

In the battery pack according to another embodiment of the present invention, the current measuring unit is configured to measure the current flowing through the battery cell over a first duration, and the control unit is configured to calculate the capacity of the battery cell based on an accumulated amount of current over the first duration.

In the battery pack according to another embodiment of the present invention, when a difference between the calculated capacity of the battery cell and the battery capacity at the time of production of the battery cell exceeds a preset threshold, the control unit is configured to determine that the battery cell has a deteriorated capacity.

In the battery pack according to another embodiment of the present invention, the battery pack further includes a voltage measurement unit configured to measure a voltage of the battery cell, wherein the storage unit is further configured to store a full charge/discharge time at the time of production of the battery cell, wherein the control unit is configured to calculate a full charge/discharge reach time of the battery cell using the voltage of the battery cell, wherein when a difference between calculated full charge/discharge reach time of the battery cell and a full charge/discharge reach time at the time of production of the battery cell exceeds a preset threshold, the control unit is configured to determine that an internal resistance of the battery cell is increased.

In the battery pack according to another embodiment of the present invention, the current measurement unit is positioned at any one of a negative electrode or a positive electrode of the battery cell.

In the battery pack according to another embodiment of the present invention, the battery pack is included in an ESS or is a vehicle battery pack.

A battery cell error determining method according to an embodiment of the present invention includes: measuring a magnetic field generated by a current flowing in a battery cell; measuring a capacity of the battery cell by accumulating a current derived from the measured magnetic field; and determining an error of the battery cell based on the measured capacity of the battery cell.

In the battery cell error determining method according to an embodiment of the present invention, the method further includes measuring a voltage of the battery cell, and further includes: calculating a full charge/discharge reach time of the battery cell based on the measured voltage of the battery cell; determining whether a difference between the calculated full charge/discharge reach time of the battery cell and a predetermined full charge/discharge reach time at the time of production of the battery cell exceeds a first preset threshold; and determining that an internal resistance of the battery is increased when the difference between the calculated full charge/discharge reach time of the battery cell and the predetermined full charge/discharge reach time at the time of production of the battery cell exceeds the first preset threshold.

In the battery cell error determining method according to an embodiment of the present invention, the method further includes determining that the capacity of the battery cell is deteriorated when a difference between the measured capacity of the battery cell and a predetermined capacity at a time of production of the battery cell exceeds a second preset threshold.

In the battery cell error determining method according to an embodiment of the present invention, the method further includes, if it is determined that the internal resistance of the battery is increased or the capacity of the battery cell is deteriorated, transmitting an internal resistance increase signal or a capacity deterioration signal.

Advantageous Effects

According to embodiments of the present invention, by measuring the capacity and voltage in units of battery cells, it is possible to achieve the effect that it is possible to more accurately determine whether the capacity degradation of the battery cells and the internal resistance increase.

DETAILED DESCRIPTION

Figure 1:
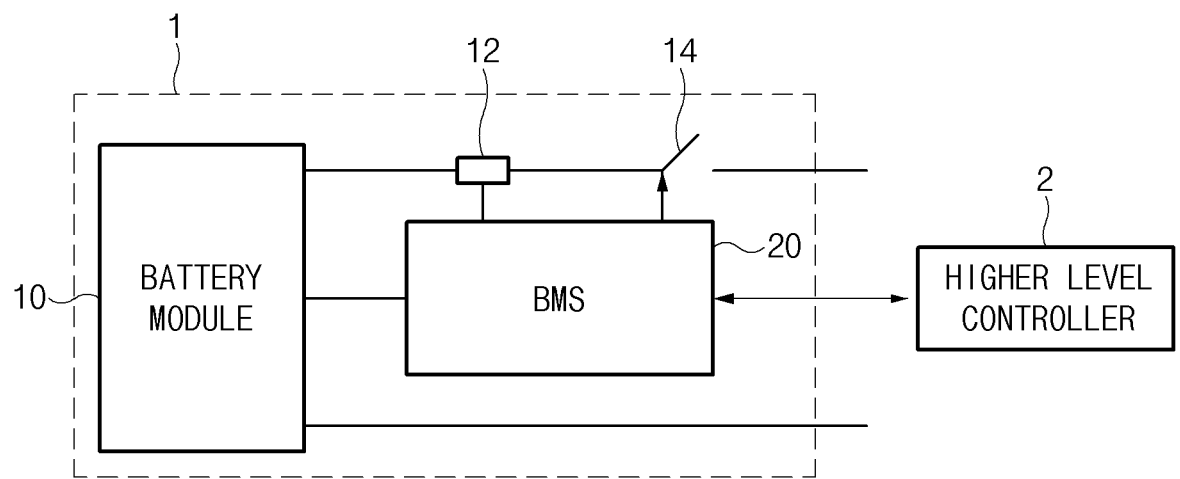
FIG. 1 is a block diagram showing the configuration of a battery control system.

Hereinafter, various embodiments of the present invention are disclosed with reference to the accompanying drawings. However, this is not intended to limit the invention to the specific embodiments, and it is to be understood that the invention includes various modifications, equivalents, and/or alternatives. With respect to the descriptions of the drawings, like reference numerals refer to like elements.

Terms used herein is for the purpose of describing particular example embodiments only and is not intended to be limiting of the scope of other embodiments. The terms of a singular form may include plural forms unless they have a clearly different meaning in the context. Otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood as having an ideal or excessively formal meaning. In any cases, even the terms defined in this specification cannot be interpreted as excluding embodiments of the present invention.

In addition, in describing the components of the embodiment of the present invention, terms such as first, second, A, B, (a), and (b) may be used. These terms are only to distinguish the components from other components, and the nature, sequence, or order of the components are not limited by the terms. In addition, if a component is described as being "connected to", "coupled to" or "linked to" another component, the components may be directly connected to or linked to each other but it should be understood that other components may be "connected", "coupled", or "linked" between each component.

FIG. 1 is a block diagram schematically illustrating a battery control system including a battery pack 1 and a higher level controller 2 included in a higher level system according to an embodiment of the present invention.

As shown in FIG. 1, the battery pack 1 includes a battery module 10 composed of one or more battery cells and capable of being charged and discharged, a switching unit 14 connected in series to the + terminal side or the − terminal side of the battery module 10 to control the charge/discharge current flow of the battery module 10, and a battery management system 20 that monitors the voltage, current, temperature, and the like of the battery pack 1 to control and manage the battery pack 1 so as to prevent overcharge and overdischarge.

Here, the switching unit 14 is a semiconductor switching element for controlling the current flow for the charge or discharge of the battery module 10, and for example, at least one MOSFET may be used.

In addition, in order to monitor the voltage, current, temperature, etc. of the battery pack 1, the battery management system (BMS) 20 can measure or calculate voltages and currents of gates, sources, and drains of semiconductor switching elements, and in addition, can measure the current, voltage, temperature, etc. of the battery pack using the sensor 12 provided adjacent to the semiconductor switching unit 14. The BMS 20 is an interface for receiving the values obtained by measuring the above-described various parameters, and may include a plurality of terminals and a circuit that is connected to these terminals and processes the received values.

In addition, the BMS 20 may control ON/OFF of the switching unit 14 such as the MOSFET and may be connected to the battery module 10 to monitor the state of the battery module 10.

The higher level controller 2 may transmit a control signal for the battery module to the BMS 20. Accordingly, operations of the BMS 20 may be controlled based on a signal applied from a higher level controller. The battery cell of the present invention may be a component included in a battery pack used for an Energy Storage System (ESS) or a vehicle. However, it is not limited to this use.

Since the configuration of the battery pack 1 and the configuration of the BMS 20 are known configurations, more detailed description thereof will be omitted.

On the other hand, the battery cell error determining apparatus according to the embodiments of the present invention is connected to each of the plurality of battery cells connected in series in the battery module 10 and determines an error of the battery cell. Although the sensor 12 measures the current, voltage, and temperature of the battery module 10 itself to measure capacity deterioration of the entire battery module 10, this is difficult to accurately measure the capacity deterioration in the battery cell unit. Therefore, hereinafter, a battery cell error determining apparatus capable of measuring capacity deterioration of a battery cell unit will be described.

Figure 2:
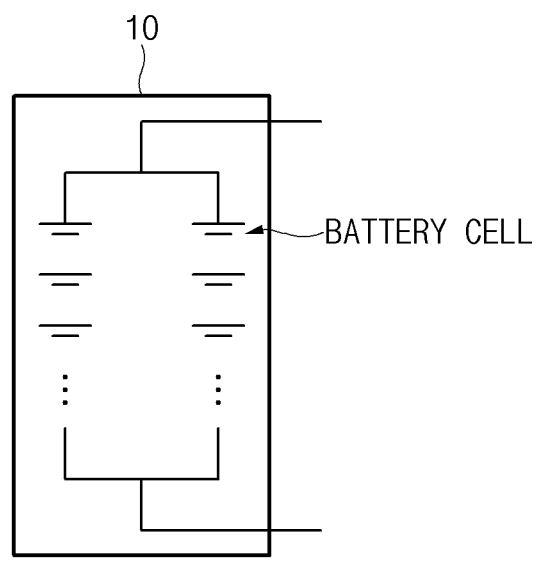
FIG. 2 illustrates a simplified configuration of a battery cell in a battery module.

FIG. 2 illustrates a simplified configuration of a battery cell in a battery module.

In the battery module 10, a plurality of battery cells are connected in series/parallel.

In general, a pack tray made of a high thermal conductivity material on the lower surface of the module housing is installed at the battery module 10. Such pack trays can absorb heat generated in each cell of the battery cell assembly.

The battery cell error determining apparatus is disposed on the negative electrode terminal and the positive electrode side of the battery cell. The battery cell error determining apparatus will be described in more detail with reference to FIGS. 3 and 4 below.

Figure 3:
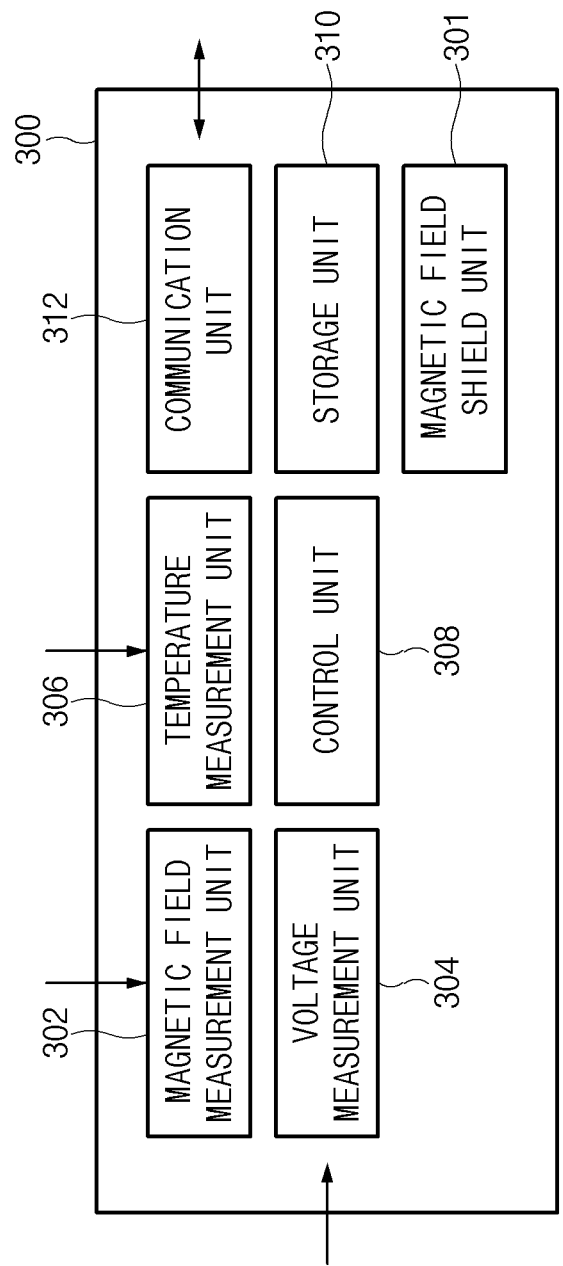
FIG. 3 is a block diagram of a battery cell error determining apparatus according to an embodiment of the present invention.

FIG. 3 is a block diagram of a battery cell error determining apparatus 300 according to an embodiment of the present invention.

The battery cell error determining apparatus 300 may be disposed across the negative terminal and the positive terminal of the battery cell. In particular, the battery cell error determining apparatus 300 may be disposed on any one of the negative electrode tab and the positive electrode tab which are drawn out of the battery cell. The battery cell error determining apparatus 300 includes a magnetic field shield unit 301, a magnetic field measurement unit 302, a voltage measurement unit 304, a temperature measurement unit 306, a control unit 308, a storage unit 310, and a communication unit 312.

The magnetic field shield unit 301 collects a magnetic field flowing in the battery cell in order to measure the current of the battery cell in units of a battery cell. The magnetic field shield unit 301 may be formed to surround at least a portion of the battery cell in order to accurately measure the magnetic field generated when current flows in the battery cell. Specifically, the magnetic field shield unit 301 may be formed to surround, for example, the lower side of the tab (anode or cathode) of the battery cell and the side portion of the battery cell. At this time, the magnetic field shield unit 301 is formed at a predetermined distance from the tab of the battery cell.

The magnetic field measurement unit 302 measures a magnetic field around the battery cell generated when current flows in the battery cell. The magnetic field generated around the battery cell may be shielded by the magnetic field shield unit 301. The current of the battery cell may be indirectly calculated using the measured magnetic field, for example, by the Biot-Savart law. For example, the magnetic field strength measured by the magnetic field measurement unit 302 may be received by the control unit 308, and the control unit 308 may calculate a current flowing in the corresponding battery cell in real time. In addition, a value obtained by accumulating the current flowing in the battery cell calculated in real time for a predetermined time may be derived as the capacity of the battery cell. Here, the predetermined time may be, for example, about 1 hour as the 1C-rate discharge reference time.

The voltage measurement unit 304 measures the voltage of the battery cell. Since the voltage measurement unit 304 measures the voltage of the battery cell, it is disposed over the negative terminal and the positive terminal (between the tabs) of the battery cell. The voltage of the battery cell measured by the voltage measurement unit 304 is transmitted to the control unit 308. The control unit 308 that receives the voltage of the battery cell from the voltage measurement unit 304 calculates the full charge/discharge reach time of the battery cell using the voltage of the battery cell. Here, the full charge/discharge reach time is a time taken for the battery cell to reach the fully charged state from the fully discharged state of the battery cell.

The temperature measurement unit 306 may measure the temperature of the battery cell. The temperature measurement unit 306 may be, for example, a thermistor, but is not limited thereto. The battery cell may change a battery charge state value (e.g., SOC) according to a temperature. Therefore, when calculating the capacity of the battery cell according to the current, it is also possible to calculate the capacity of the battery cell by referring to the temperature of the battery cell. The capacity change of the battery cell according to the temperature of the battery cell may be calculated using the capacity of the battery cell according to the temperature of the battery cell determined by the experiment as a reference table.

The control unit 308 calculates a real time current of the battery cell using the magnetic field value of the battery cell received by the magnetic field measurement unit 302. In addition, the control unit 308 calculates the capacity of the battery cell by accumulating the calculated current of the battery cell for a predetermined time. In this case, the control unit 308 may reflect the capacity of the battery cell using the temperature measured by the temperature measurement unit 306. The capacity change reference table of the battery cell according to the temperature of the battery cell determined through the experiment in advance may be used when calculating the capacity of the battery cell.

In addition, the control unit 308 compares the capacity of the battery cell with the capacity of the battery cell at the time of production of the battery cell, which is stored in advance. In relation to the capacity of the battery cell at the time of production of the battery cell, the capacity value of the battery cell measured at the time of production is stored in the storage unit 310. If the difference between the derived capacity of the battery cell and the stored capacity of the battery cell at the time of production of the battery cell exceeds the preset threshold, the control unit 308 determines that the capacity of the battery cell has been deteriorated.

In addition, the control unit 308 calculates the full charge/discharge reach time of the battery cell using the voltage measured by the voltage measurement unit 304. If the difference between the calculated full charge/discharge reach time of the battery cell and the full charge/discharge reach time at the time of production of the battery cell exceeds a preset threshold, the control unit 308 determines that the battery cell is deteriorated due to an increase in the internal resistance of the battery cell.

The storage unit 310 stores identification information (e.g., ID) of the battery cell to which the battery cell error determining apparatus is connected. In addition, the storage unit 310 stores an initial production capacity of the battery cell. The initial production capacity is the capacity of the battery cell at the time of shipment. In addition, a capacity table according to the current of the battery cell at the time of production or a capacity table according to the voltage of the battery cell may be stored in the storage unit 310. In addition, the storage unit 310 stores the full charge/discharge reach time information at the time of production of the battery cell.

The communication unit 312 may transmit a signal indicating an error of the battery cell, such as a battery cell capacity deterioration signal or a battery cell internal resistance increase signal, to an external device, for example, a battery management system connected to the battery module, together with identification information on the corresponding battery cell, under control of the control unit 308. The error of the battery cell may be a case where the difference between the capacity of the battery cell derived by the control unit 308 and the pre-stored capacity of the battery cell at the time of production of the battery cell exceeds a preset threshold so that it is determined that the capacity of the corresponding battery cell is deteriorated. In addition, the error of the battery cell may be a case where the difference between the full charge/discharge reach time of the battery cell calculated by the control unit 308 and the full charge/discharge reach time at the time of production of the battery cell exceeds a predetermined threshold so that it is determined that the battery cell is deteriorated due to an increase in the internal resistance of the battery cell.

Figure 4A:
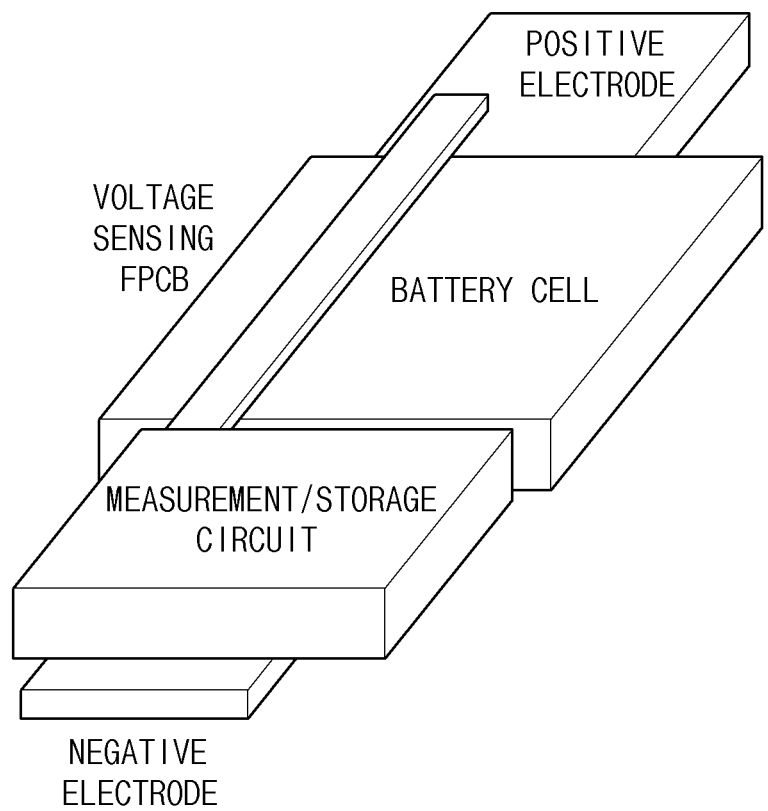
FIGS. 4A to 4C illustrate an implementation example of a battery cell error determining apparatus according to one embodiment of the invention.
Figure 4B:
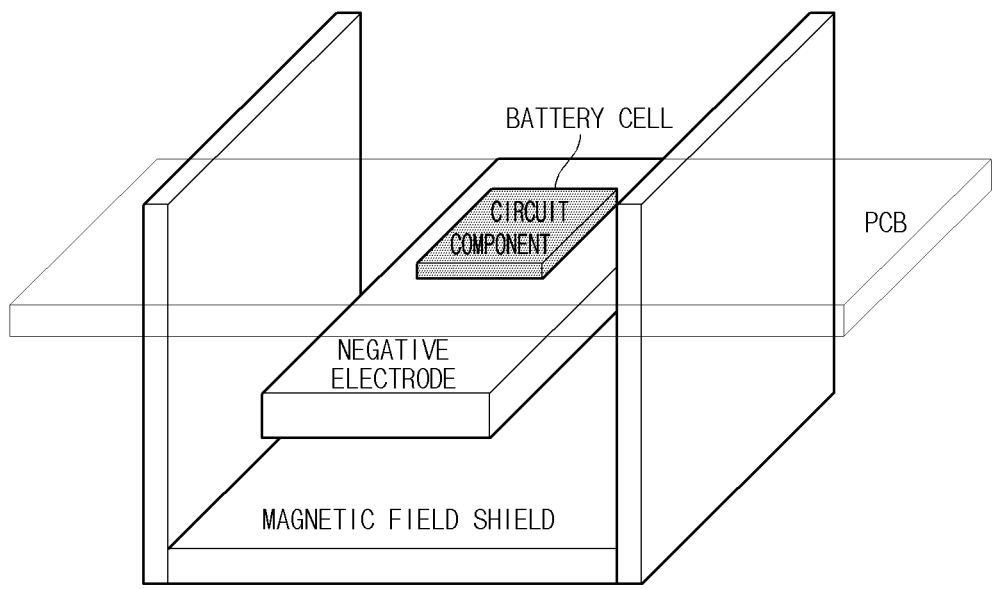
Figure 4C:
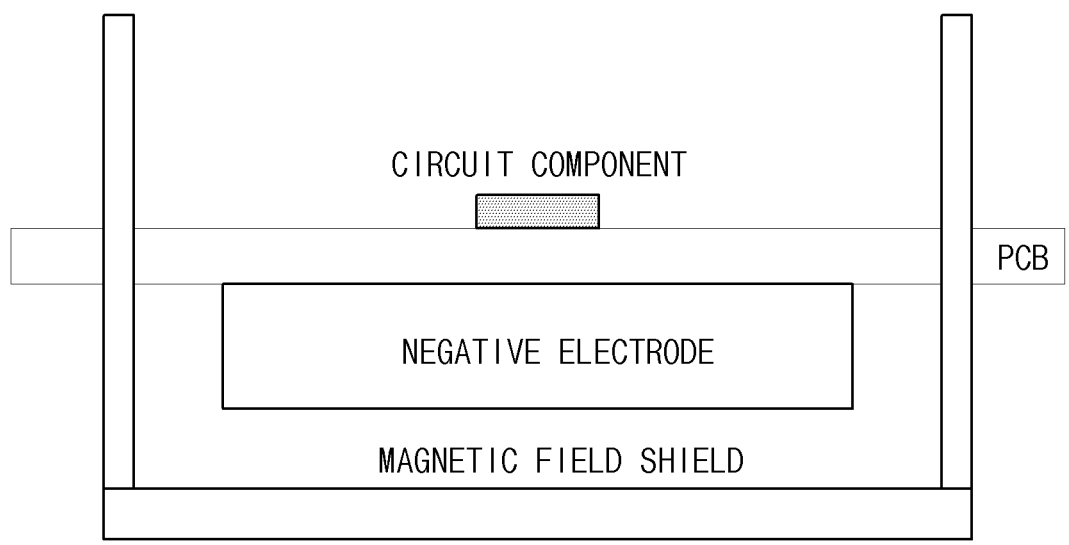

FIGS. 4A to 4C illustrate a simplified implementation of a battery cell error determining apparatus according to one embodiment of the invention.

Referring to FIG. 4A, there is shown a voltage sensing unit generated across a positive terminal and a negative terminal of a battery cell. The voltage sensing unit may be regarded as a configuration corresponding to the voltage measurement unit 304 in the configuration of FIG. 3. The voltage sensing unit is disposed across the positive terminal and the negative terminal of the battery cell to sense the voltage of the battery cell. The voltage measured by the voltage sensing unit is transmitted to a measurement/storage circuit.

The measurement/storage circuit is disposed on the upper side of the negative terminal of the battery cell. The measurement/storage circuit may include configurations corresponding to the magnetic field measurement unit 302, the temperature measurement unit 306, the control unit 308, the storage unit 310, and the communication unit 312 in the configuration of FIG. 3.

The voltage measured by the voltage sensing unit is transmitted to the measurement/storage circuit, and the full charge/discharge reach time of the battery cell is calculated using the voltage of the battery cell transmitted from the control unit 308 of the measurement/storage circuit. If the difference between the calculated full charge and discharge reach time of the battery cell and the full charge and discharge reach time at the time of production of the battery cell exceeds a preset threshold, the control unit 308 determines that the battery cell is deteriorated due to an increase in the internal resistance of the battery cell.

In addition, the magnetic field measurement unit 302 of the measurement/storage circuit measures a magnetic field around the battery cell generated when current flows in the battery cell. For example, the magnetic field strength measured by the magnetic field measurement unit 302 may be received by the control unit 308, and the control unit 308 may calculate a current flowing in the corresponding battery cell in real time. In addition, a value obtained by accumulating the current flowing in the battery cell calculated in real time for a predetermined time may be derived as the capacity of the battery cell.

The control unit 308 of the measurement/storage circuit derives the capacity of the battery cell and determines that the capacity of the battery cell is deteriorated if the difference between the derived capacity of the battery cell and the stored capacity of the battery cell at the time of production of the battery cell exceeds the preset threshold.

In addition, the measurement/storage circuit may include a thermistor or the like capable of measuring the temperature of the battery cell. For example, the thermistor may be a configuration corresponding to the temperature measurement unit 306 of the battery cell error determining apparatus of FIG. 3.

When determining whether the capacity of the battery cell is deteriorated, the control unit 308 may determine the deterioration by reflecting the temperature of the battery cell measured by the thermistor or the like. In this case, the capacity change reference table of the battery cell according to the temperature of the battery cell determined through the experiment in advance may be used.

The storage unit 310 may also be disposed in the measurement/storage circuit. The storage unit 310 stores identification information (e.g., ID) of the battery cell to which the battery cell error determining apparatus is connected. In addition, the storage unit 310 stores an initial production capacity of the battery cell. The initial production capacity is the capacity at the time of shipment of the battery cell. Accordingly, a capacity table according to the current of the battery cell at the time of production or a capacity table according to the voltage of the battery cell may be stored in the storage unit 310. In addition, the storage unit 310 stores the full charge/discharge reach time information at the time of production of the battery cell.

The communication unit 312 may also be disposed in the measurement/storage circuit. When the difference between the capacity of the battery cell derived by the control unit 308 and the pre-stored capacity of the battery cell at the time of production of the battery cell exceeds the preset threshold so that it is determined that the capacity of the battery cell is deteriorated, or when the difference between the calculated full charge/discharge reach time of the battery cell and the full charge/discharge reach time of the corresponding battery cell at the time of production exceeds a preset threshold so that it is determined that the battery cell is deteriorated due to an increase in the internal resistance of the battery cell, the communication unit 312 may transmit a battery cell capacity deterioration signal or a battery cell internal resistance increase signal together with identification information on the corresponding battery cell to a battery management system connected to an external device, for example, a battery module.

Referring to FIG. 4B, there is shown a magnetic field shield that wraps the lower and side surfaces of the tab of the battery cell at a distance and a printed circuit board (PCB) including a circuit component corresponding to the measurement/storage circuit disposed on the upper surface of the tab of the battery cell.

The magnetic field shield collects the magnetic field generated when current flows through the battery cell. The magnetic field generated by the current of the battery cells collected by the magnetic field shield is measured by the magnetic field measurement unit 302 of the measurement/storage circuit.

The magnetic field shield may be formed of, for example, nickel alloy (Ni-alloy).

Referring to FIG. 4C, there is shown a side view of a configuration of a PCB including a circuit component corresponding to a measurement/storage circuit disposed on an upper surface of a tab of a battery cell, and a magnetic field shield that is formed to surround the bottom and side surfaces of the tab of the battery cell with a predetermined distance.

A circuit is formed on the PCB substrate that is attached to the upper surface of the tab of the battery cells, and the PCB substrates are attached to both sides of the magnetic field shield surrounding the tab of the battery cell.

Figure 5:
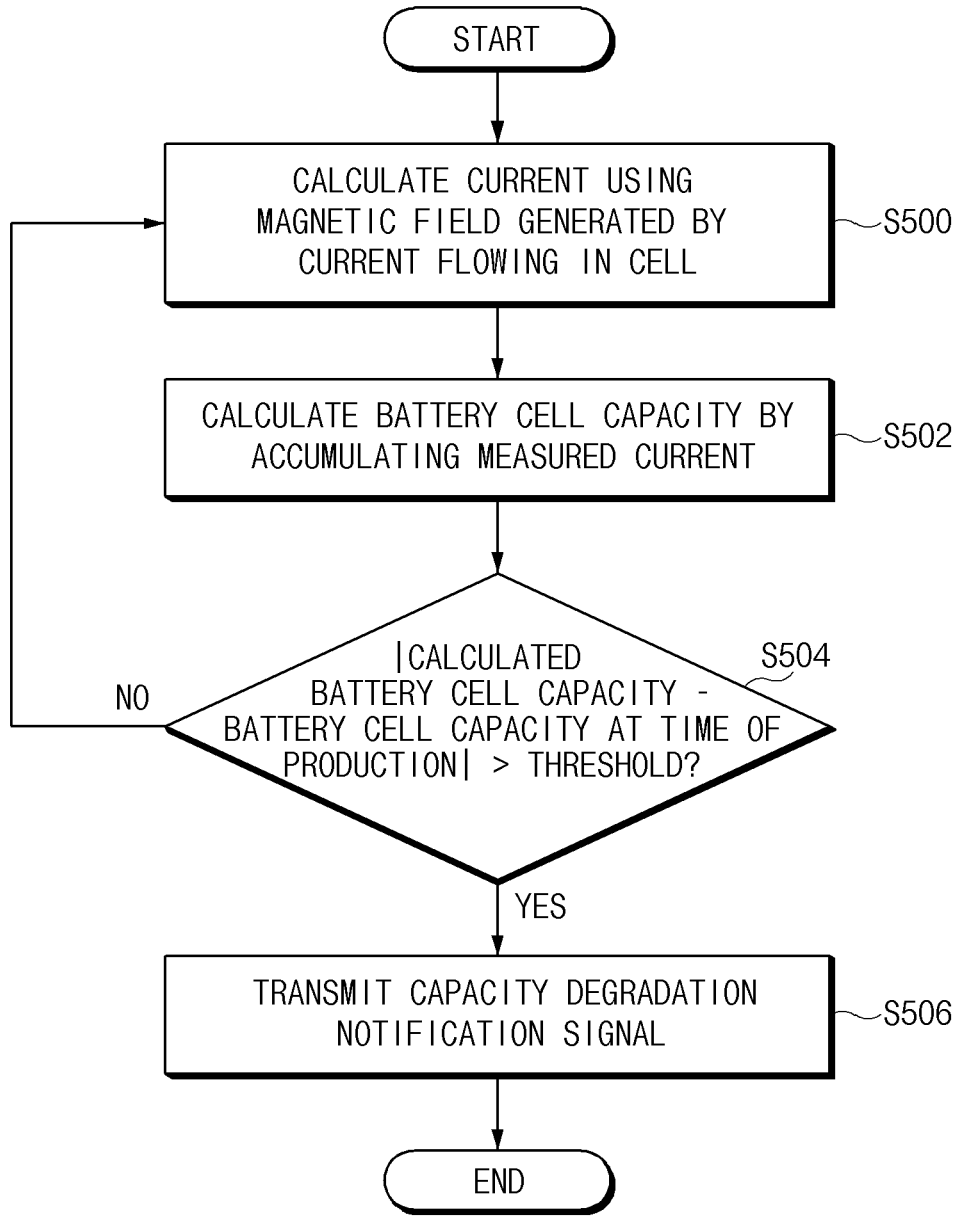
FIG. 5 is a flowchart illustrating a method for determining a battery cell error according to an embodiment of the present invention.

FIG. 5 is a flowchart illustrating a method for determining a battery cell error according to an embodiment of the present invention.

The magnetic field generated by the current flowing through the battery cell is collected by the magnetic field shield unit. The collected magnetic field is measured by the magnetic field measurement unit 302, and the measured magnetic field strength is transmitted to the control unit 308. The control unit 308 receiving the measured magnetic field strength calculates a current flowing in the battery cell in real time using the measured magnetic field strength (S500). For example, the current of the battery cell may be indirectly calculated using the measured magnetic field, for example, by the Biot-Savart law. For example, the magnetic field strength measured by the magnetic field measurement unit 302 may be received by the control unit 308, and the control unit 308 may calculate a current flowing in the corresponding battery cell in real time.

The control unit 308 accumulates the calculated current for a predetermined time to calculate the capacity of the battery cell (S502). The equation for accumulating the calculated current for a predetermined time is as follows:

$$\int_{t_0}^{t_1} \Delta i dt [Ah]$$

The control unit 308 determines whether the difference between the calculated capacity of the battery cell and the capacity at the time of production of the corresponding battery cell, which is stored in the storage unit 310, exceeds a preset threshold (S504).

Here, in addition, the temperature measurement unit 306 may measure the temperature of the battery cell. The temperature measurement unit 306 may be a thermistor, for example. The battery cell may change a battery charge state value (e.g., SOC) according to a temperature. Therefore, when calculating the capacity of the battery cell according to the current, it is also possible to calculate the capacity of the battery cell by referring to the temperature of the battery cell. The capacity change of the battery cell according to the temperature of the battery cell may be calculated using the capacity of the battery cell according to the temperature of the battery cell determined by the experiment as a reference table.

If the control unit 308 determines that the difference between the calculated capacity of the battery cell and the capacity at the time of production of the corresponding battery cell stored in the storage unit 310 does not exceed a preset threshold, it calculates the magnetic field measurement generated by the current flowing through the battery cell as the current value of the battery cell.

When the control unit 308 determines that the difference between the calculated capacity of the battery cell and the capacity at the time of production of the corresponding battery cell stored in the storage unit 310 exceeds a preset threshold, it causes the communication unit 312 to transmit a capacity deterioration notification signal of the battery cell (S506).

Figure 6:
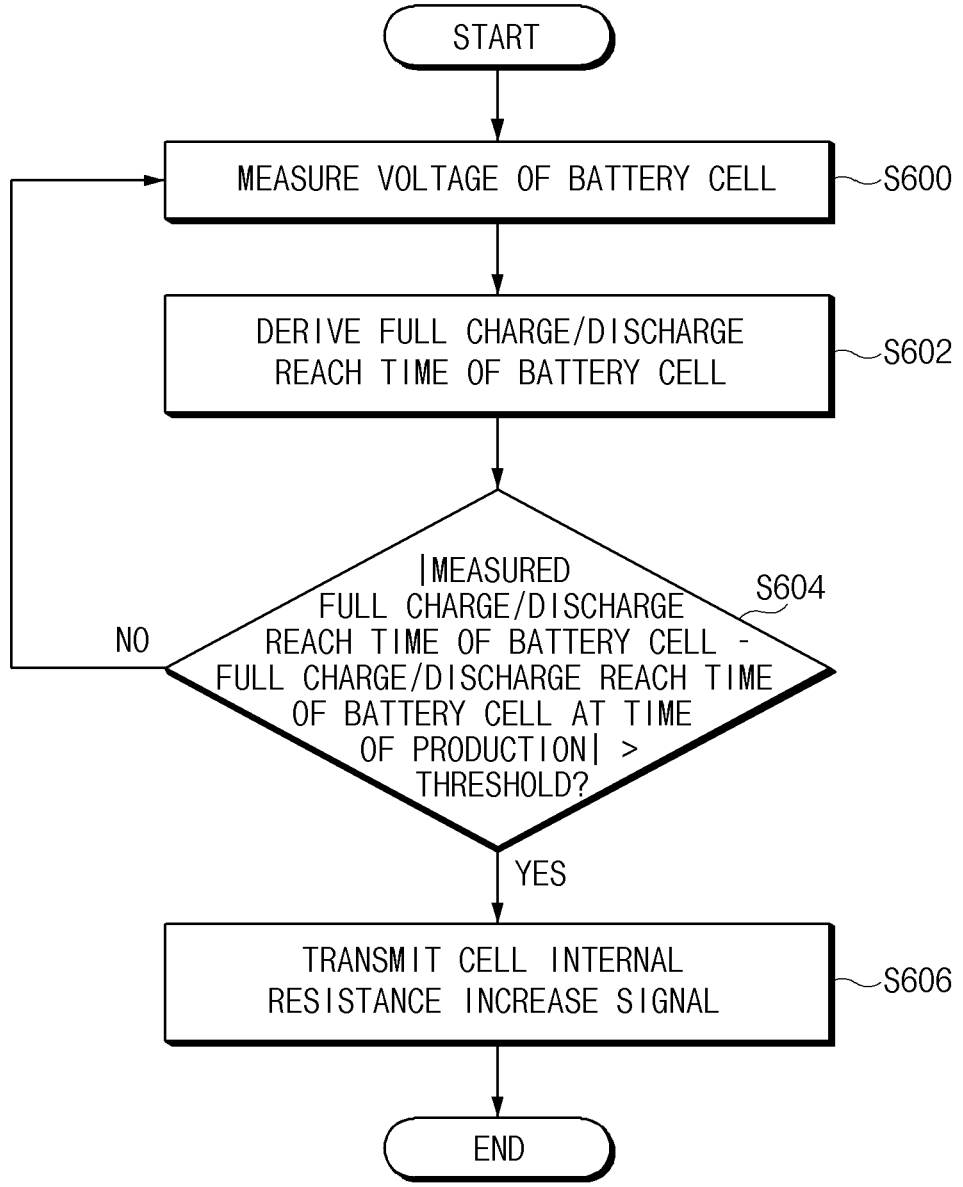
FIG. 6 is a flowchart illustrating a method for determining a battery cell error according to another embodiment of the present invention.

FIG. 6 is a flowchart illustrating a method for determining a battery cell error according to another embodiment of the present invention.

The voltage measurement unit 304 measures the voltage of the battery cell (S600). Since the voltage measurement unit 304 measures the voltage of the battery cell, it is disposed over the negative terminal and the positive terminal of the battery cell. The voltage of the battery cell measured by the voltage measurement unit 304 is transmitted to the control unit 308.

The control unit 308, which receives the measured voltage of the battery cell from the voltage measurement unit 304 in real time, uses the received voltage of the battery cell to measure the time taken for the battery cell to reach full charge from a fully discharged state. That is, the control unit 308 derives the full charge/discharge reach time of the battery cell (S602).

In addition, the control unit 308 compares the derived charging and discharging time of the battery cell with the charge/discharge reach time of the battery cell at the time of production of the battery cell, which is stored in advance. The control unit 308 determines whether the difference between the derived charge/discharge reach time of the battery cell and the pre-stored charge/discharge reach time of the battery cell at the time of production of the battery cell exceeds a preset threshold (S604).

If the difference between the derived charge/discharge reach time of the battery cell and the pre-stored charge/discharge reach time of the battery cell at the time of production of the battery cell exceeds a preset threshold, the control unit 308 causes the communication unit 312 to transmit an internal resistance increase signal of the battery cell (S606).

On the other hand, if the difference between the derived charge/discharge reach time of the battery cell and the pre-stored charge/discharge reach time of the battery cell at the time of production of the battery cell does not exceed a preset threshold, the control unit 308 causes the voltage measurement unit 304 to measure the voltage of the battery cell.

Figure 7:
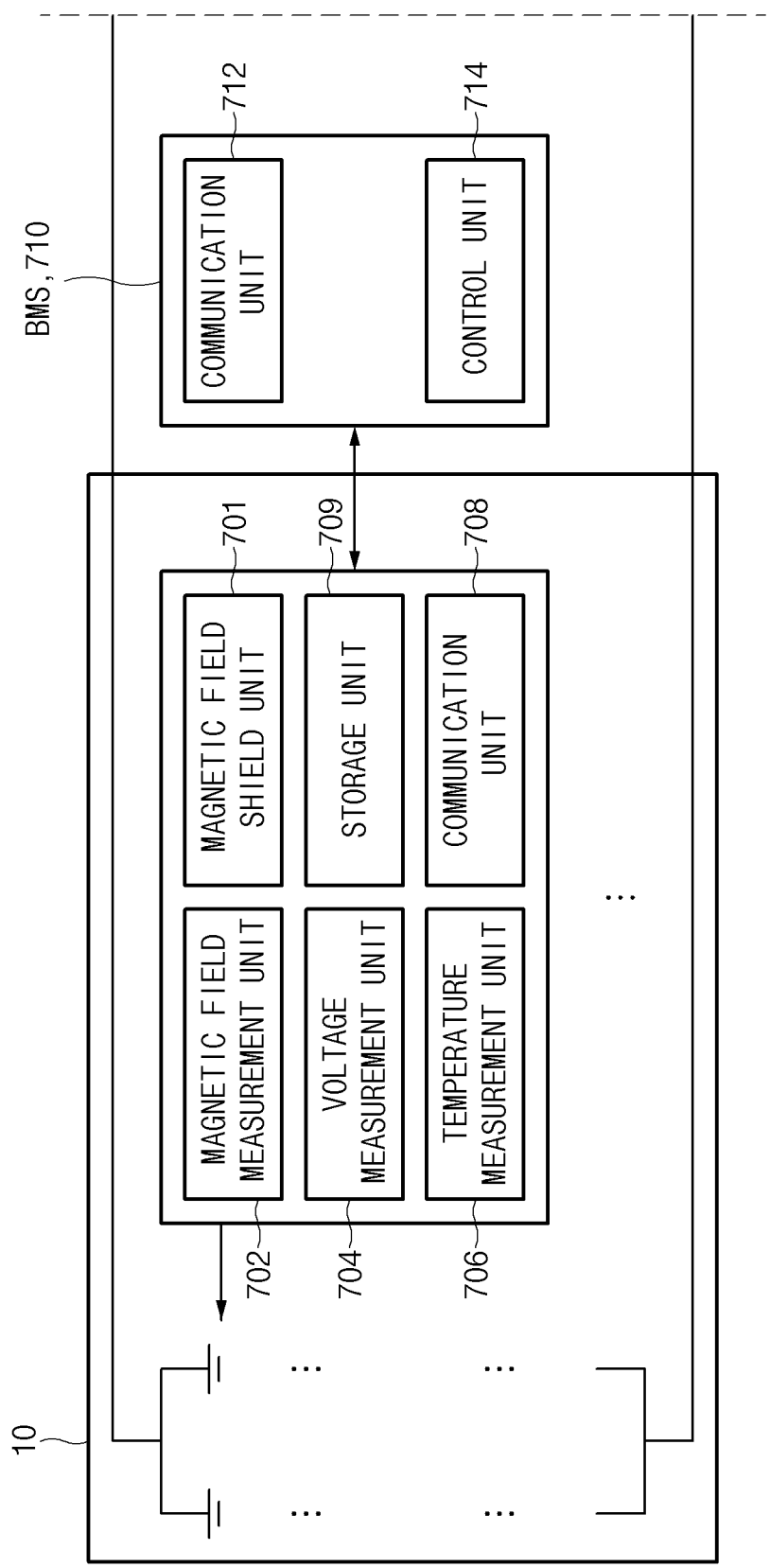
FIG. 7 is a block diagram of a battery cell error determining apparatus according to another embodiment of the present invention.

FIG. 7 is a block diagram of a battery cell error determining apparatus according to another embodiment of the present invention.

The battery cell error determining apparatus 700 includes a magnetic field shield unit 701, a magnetic field measurement unit 702, a voltage measurement unit 704, a temperature measurement unit 706, and a communication unit 708.

The magnetic field shield unit 701 collects a magnetic field flowing in the battery cell in order to measure the current of the battery cell in units of a battery cell. The magnetic field shield unit 701 may be formed to surround the lower surface and the side surface of the tab of the battery cell with a predetermined distance to accurately measure the magnetic field generated when current flows in the battery cell. The magnetic field shield unit 701 may be composed of a nickel alloy, for example.

The magnetic field measurement unit 702 measures a magnetic field around the battery cell generated when current flows in the battery cell. The current of the battery cell may be indirectly calculated using the measured magnetic field, for example, by the Biot-Savart law.

The voltage measurement unit 704 measures the voltage of the battery cell. Since the voltage measurement unit 704 measures the voltage of the battery cell, it is disposed over the negative terminal and the positive terminal of the battery cell.

The temperature measurement unit 706 may measure the temperature of the battery cell. The temperature measurement unit 306 may be a thermistor, for example. Since the battery cell may change a battery charging state value (e.g., SOC) according to the temperature, when calculating the capacity of the battery cell according to the current, it is also possible to calculate the capacity of the battery cell by referring to the temperature of the battery cell. The capacity change of the battery cell according to the temperature of the battery cell may be calculated using the capacity of the battery cell according to the temperature of the battery cell determined by the experiment as a reference table.

The communication unit 708 transmits a magnetic field strength, a voltage value, and a temperature respectively measured by the magnetic field measurement unit 702, the voltage measurement unit 704, and the temperature measurement unit 706 to the battery management system (BMS) 710. The communication unit 708 may transmit the magnetic field strength, voltage value, and temperature of the battery cell by wireless or wire to the BMS 710. In addition, the communication unit 708 transmits identification information on the battery cell stored in the storage unit 709, an initial production capacity of the battery cell, and full charge/discharge reach time information at the time of production of the battery cell together.

The storage unit 709 stores identification information (e.g., ID) of the battery cell to which the battery cell error determining apparatus is connected. In addition, the storage unit 709 stores an initial production capacity of the battery cell. The initial production capacity can be derived from a capacity table according to the voltage of the battery cell. Accordingly, a capacity table according to the current of the battery cell at the time of production or a capacity table according to the voltage of the battery cell may be stored in the storage unit 709. In addition, the storage unit 709 stores the full charge/discharge reach time information at the time of production of the battery cell.

However, instead of the configuration of the magnetic field shield unit 701 and the magnetic field measurement unit 702, the current measurement unit may measure the current of the battery cell. In this case, the current value measured by the current measurement unit is transmitted to the BMS.

The communication unit 712 of the BMS 710 receives a magnetic field strength, a voltage value, and a temperature of a specific battery cell from the battery cell error determining apparatus 700 by wireless or wired.

The communication unit 712 transmits, to the control unit 714, the received magnetic field strength, voltage value, temperature of the battery cell, identification information on the battery cell, capacity information at the time of production of the battery cell, and full charge reach time information at the time of production of the battery cell.

The control unit 714 calculates a real time current of the battery cell using the received magnetic field value of the battery cell. The control unit 714 calculates the capacity of the battery cell by accumulating the calculated current of the battery cell for a predetermined time. In this case, the control unit 714 may reflect the capacity of the battery cell using the temperature measured by the temperature measurement unit 706. The capacity change reference table of the battery cell according to the temperature of the battery cell determined through the experiment in advance may be used.

In addition, the control unit 714 compares the capacity of the battery cell with the capacity of the battery cell at the time of production of the battery cell, which is stored in advance. The capacity of the battery cell at the time of production of the battery cell is stored in the storage unit 709. If the difference between the derived capacity of the battery cell and the stored capacity of the battery cell at the time of production of the battery cell exceeds the preset threshold, the control unit 714 determines that the capacity of the battery cell has been deteriorated.

In addition, the control unit 714 calculates the full charge/discharge reach time of the battery cell using the voltage measured by the voltage measurement unit 704. If the difference between the calculated full charge and discharge reach time of the battery cell and the full charge and discharge reach time at the time of production of the battery cell exceeds a preset threshold, the control unit 714 determines that the battery cell is deteriorated due to an increase in the internal resistance of the battery cell.

In this embodiment, the capacity and full charge/discharge reach time of the corresponding battery cell at the time of production are stored in the storage unit 709, but may be stored in a separate storage unit (not shown) of the BMS.

Alternatively, if the storage unit 709 stores the capacity of the corresponding battery cell at the time of production and the full charge/discharge reach time and the BMS receives the capacity and full charge/discharge reach time of the corresponding battery cell at the time of production, they may be stored together with the identification information on the corresponding battery cell for later use.

Figure 8:
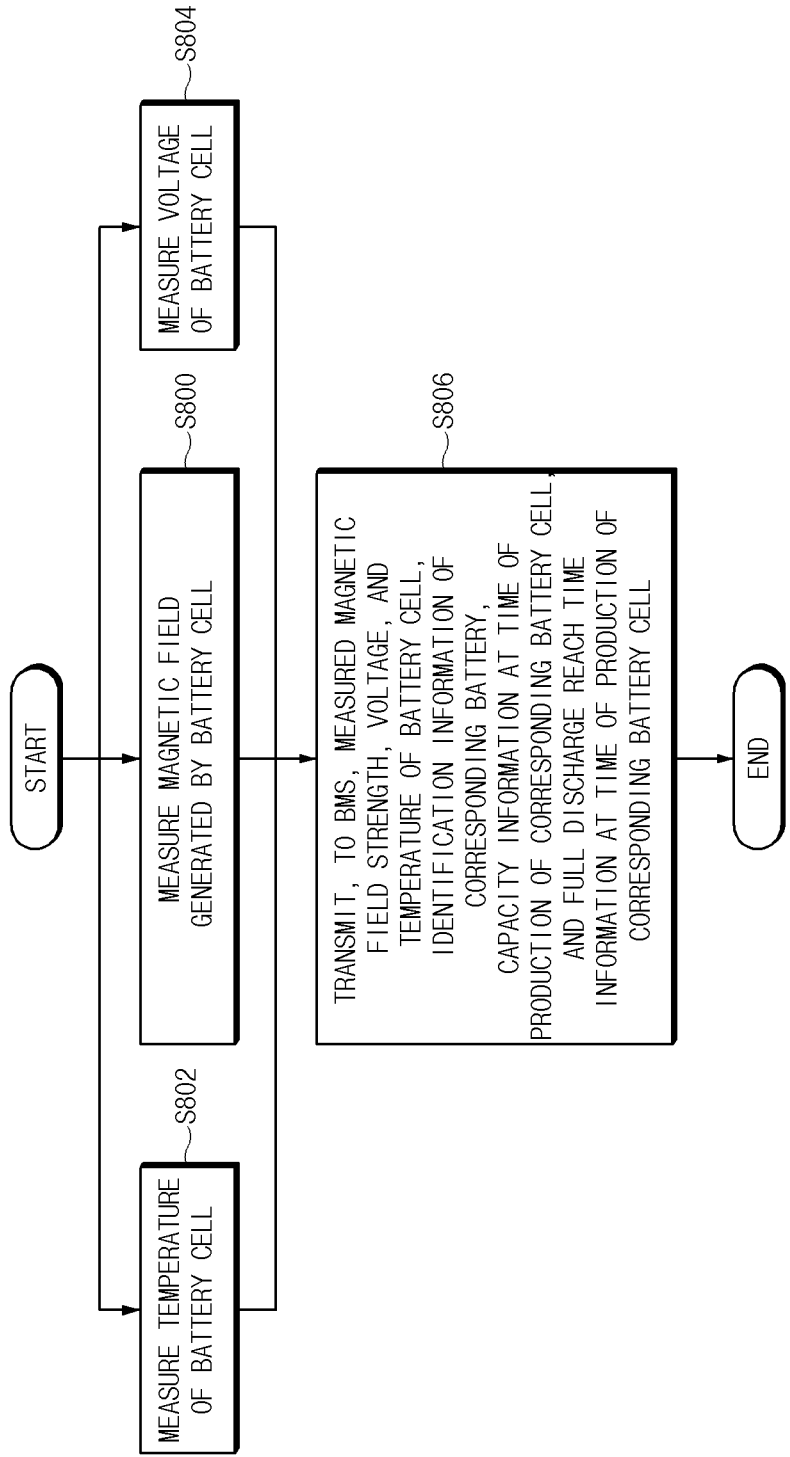
FIG. 8 is a flowchart illustrating a method for determining a battery cell error according to another embodiment of the present invention.

FIG. 8 is a flowchart illustrating a method for determining a battery cell error according to another embodiment of the present invention.

The magnetic field measurement unit 702 measures a magnetic field around the battery cell generated when current flows in the battery cell (S800). The magnetic field generated around the battery cell may be shielded by the magnetic field shield unit 701.

In addition, the voltage of the battery cell is measured by the voltage measurement unit 704 (S802). Since the voltage measurement unit 704 measures the voltage of the battery cell, it is disposed over the negative terminal and the positive terminal of the battery cell.

In addition, the temperature of the battery cell is measured by the temperature measurement unit 706 (S802). The temperature measurement unit 706 may be a thermistor, for example. Since the battery cell may change a battery charging state value (e.g., SOC) according to the temperature, when calculating the capacity of the battery cell according to the current, it is also possible to calculate the capacity of the battery cell by referring to the temperature of the battery cell. The capacity change of the battery cell according to the temperature of the battery cell may be calculated using the capacity of the battery cell according to the temperature of the battery cell determined by the experiment as a reference table.

In addition, the communication unit 708 transmits, to the BMS, identification information on the battery cell, an initial production capacity of the battery cell, and full charge/discharge reach time information at the time of production of the battery cell together with the measured magnetic field strength, voltage, and temperature of the battery cell (S806).

Figure 9:
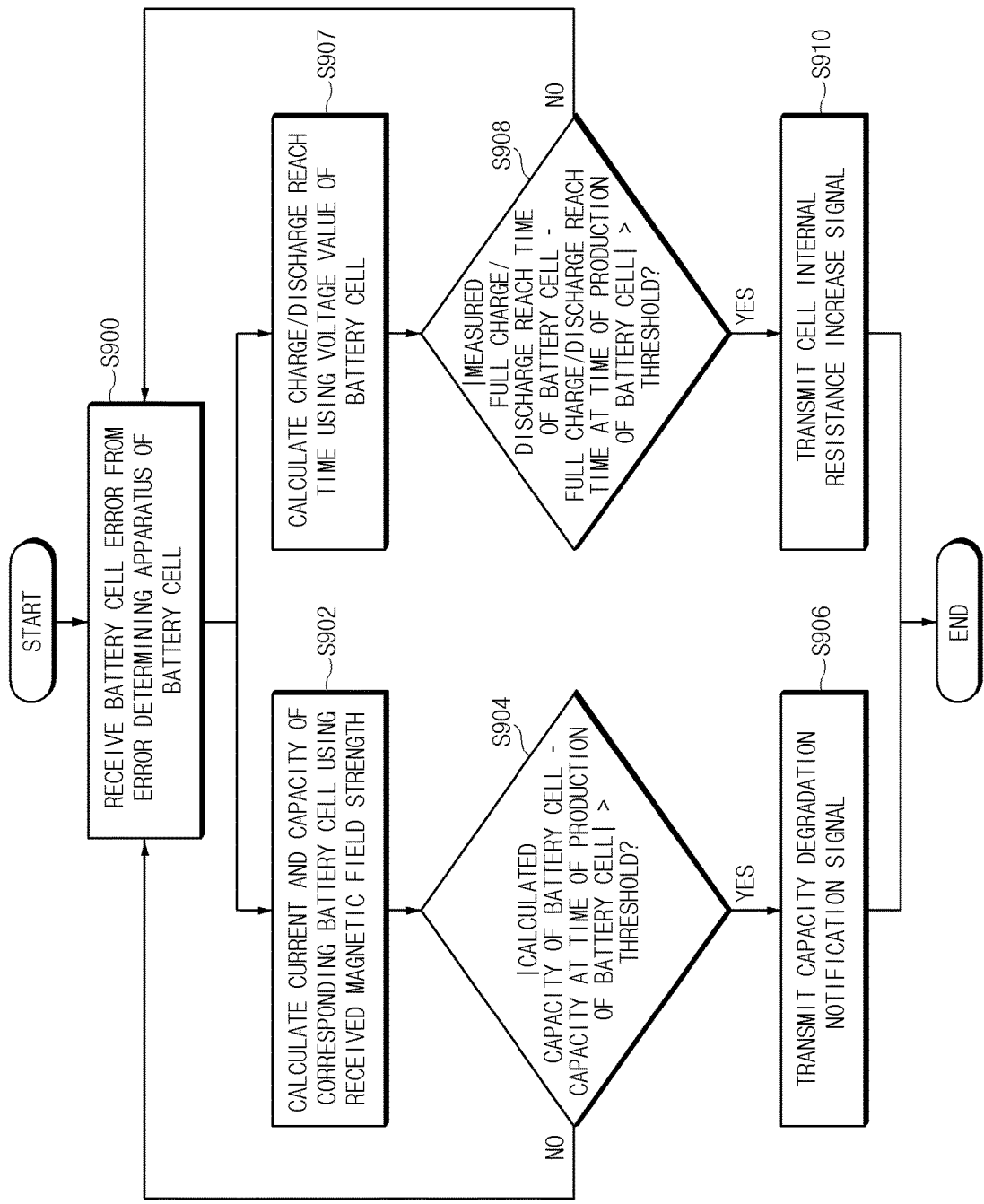
FIG. 9 is a flowchart illustrating a method for determining a battery cell error according to another embodiment of the present invention.

FIG. 9 is a flowchart illustrating a method for determining a battery cell error according to another embodiment of the present invention.

The BMS 710 receives, from the battery cell error determining apparatus of each of a plurality of battery cells, identification information on the battery cell, an initial production capacity of the battery cell, and full charge/discharge reach time information at the time of production of the battery cell together with the measured magnetic field strength, voltage, and temperature of the battery cell (S900). The communication unit 712 of the BMS 710 receives information from each battery cell error determining apparatus by wireless or wired.

The control unit 714 of the BMS 710 calculates a current flowing in the battery cell in real time using the received magnetic field strength (S902). For example, the current of the battery cell may be indirectly calculated using the measured magnetic field, for example, by the Biot-Savart law.

Then, the control unit 714 accumulates the calculated current for a predetermined time to calculate the capacity of the battery cell (S904). The equation for accumulating the calculated current for a predetermined time is as follows:

$$\int_{t_0}^{t_1} \Delta i \, dt \, [Ah]$$

The control unit 714 calculating the capacity of the specific battery cell determines whether the difference between the calculated capacity of the battery cell and the capacity at the time of production of the battery cell exceeds a preset threshold (S906).

Here, in addition, since the battery cell may change a battery charging state value (e.g., SOC) according to the temperature, when calculating the capacity of the battery cell according to the current, it is also possible to calculate the capacity of the battery cell by referring to the temperature of the battery cell. The capacity change of the battery cell according to the temperature of the battery cell may be calculated using the capacity of the battery cell according to the temperature of the battery cell determined by the experiment as a reference table.

If the control unit 714 determines that the difference between the calculated capacity of the battery cell and the capacity at the time of production of the battery cell does not exceed a preset threshold, it receives information on the battery cell from the battery cell error determining apparatus in real time again.

However, if the control unit 714 determines that the difference between the calculated capacity of the battery cell and the capacity at the time of production of the battery cell exceeds a preset threshold, it causes the communication unit 712 to transmit the capacity deterioration notification signal of the battery cell to the higher level controller 2 (S906).

Meanwhile, the control unit 714 also calculates the full charge/discharge reach time of the battery cell using the received voltage of the specific battery cell. In addition, the control unit 714 determines whether the difference between the calculated full charge/discharge reach time of the specific battery cell and the full charge/discharge reach time at the time of production of the battery cell exceeds a preset threshold value (S908).

If the difference between the derived charge/discharge reach time of the battery cell and the pre-stored charge/discharge reach time of the battery cell at the time of production of the battery cell exceeds a preset threshold, the control unit 714 causes the communication unit 712 to transmit the internal resistance increase signal of the battery cell to the higher level controller 2 (S910).

On the other hand, if the difference between the derived charge/discharge reach time of the battery cell and the charge/discharge reach time at the time of production of the battery cell stored in advance does not exceed a preset threshold, the control unit 308 receives the information on the battery cell from the battery cell error determining apparatus in real time again.

Figure 10:
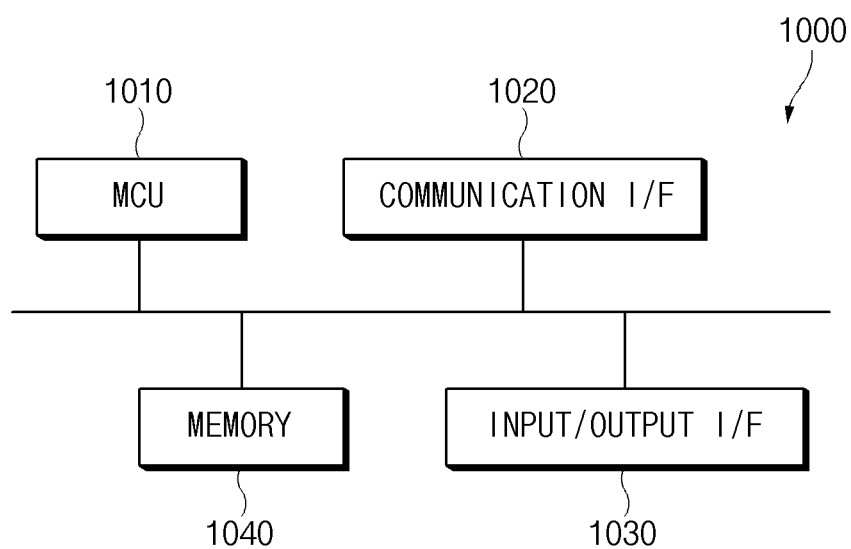
FIG. 10 is a block diagram illustrating a hardware configuration of a battery management system according to an embodiment of the present invention.

FIG. 10 is a block diagram illustrating a hardware configuration of a battery management system according to an embodiment of the present invention.

A battery management system 1000 may include a microcontroller unit (MCU) 1010 for controlling various processes and components, a memory 1040 in which an operating system program and various programs (for example, a battery pack error diagnosis program or a battery pack temperature estimation program) are recorded, an input/output interface 1030 for providing an input interface and an output interface between the battery cell module and/or the semiconductor switching element, and a communication interface 1020 capable of communicating with the outside through a wired or wireless communication network. As described above, the computer program according to the present invention may be recorded in the memory 1040 and processed by the microcontroller 1010 to be implemented as a module for performing the respective functional blocks shown in FIG. 3 and FIG. 7.

Reference herein to 'one embodiment' of the principles of the present invention and various modifications of such expressions means that, in relation to this embodiment, the specific features, structures, characteristics, and the like are included in at least one embodiment of the principles of the present invention. Thus, the expression 'in one embodiment' and any other modifications disclosed throughout the specification are not necessarily all referring to the same embodiment.

All the embodiments and conditional examples disclosed in this specification are described to intend to help those skilled in the art to understand the principles and concepts of the present invention, so that it will be understood by those skilled in the art that various changes in form and details may be made therein without departing from the spirit and scope of the present invention. Therefore, the disclosed embodiments should be considered in descriptive sense only not in limited perspective sense. The scope of the invention is defined not by the detailed description of the invention but by the appended claims, and all differences within the scope will be construed as being included in the present invention.

The invention claimed is:

1. A battery cell error determining apparatus comprising:
   a magnetic field measurement unit configured to measure a magnetic field generated by a current flowing in a battery cell;
   a voltage measurement unit configured to measure a voltage of the battery; and
   a control unit configured to:
      calculate a capacity of the battery cell based on an amount of current derived from the magnetic field measured by the magnetic field measurement unit; and
      determine an error of the battery cell based on the capacity of the battery cell,
   wherein the control unit calculates a full charge/discharge reach time of the battery cell based on the voltage of the battery cell and determines the error of the battery cell based on the full charge/discharge reach time of the battery cell.

2. The battery cell error determining apparatus of claim 1, further comprising a magnetic field shield unit adapted to collect the magnetic field generated by the current flowing in the battery cell.

3. The battery cell error determining apparatus of claim 2, wherein the magnetic field measurement unit and the magnetic field shield unit are positioned at any one of a negative electrode and a positive electrode of the battery cell.

4. The battery cell error determining apparatus of claim 1, further comprising a storage unit configured to store a battery capacity at a time of production of the battery cell.

5. The battery cell error determining apparatus of claim 4, wherein the control unit is configured to:
   derive the amount of current over a first duration; and
   calculate the capacity of the battery cell based on an accumulated amount of current over the first duration.

6. The battery cell error determining apparatus of claim 4, wherein, when a difference between the calculated capacity of the battery cell and the battery capacity at the time of production of the battery cell exceeds a preset threshold, the control unit is configured to determine that the battery cell has a deteriorated capacity.

7. The battery cell error determining apparatus of claim 4, wherein the storage unit is further configured to store a full charge/discharge time at the time of production of the battery cell,
   wherein, when a difference between calculated full charge/discharge reach time of the battery cell and the full charge/discharge reach time at the time of production of the battery cell exceeds a preset threshold, the control unit is configured to determine that an internal resistance of the battery cell is increased.

8. The battery cell error determining apparatus of claim 1, wherein the battery cell is included in an energy storage system (ESS) or is a vehicle battery cell.

9. A battery pack comprising:
   a plurality of battery cells connected in series; and
   a respective battery cell error determining apparatus included in each battery cell,
   wherein, for each given battery cell, the battery cell error determining apparatus included therein comprises:
      a current measurement unit configured to measure a current flowing through the battery cell;
      a voltage measurement unit configured to measure a voltage of the battery; and
      a control unit configured to calculate a capacity of the battery cell based on the current,
   wherein the control unit is configured to determine an error of the battery cell based on the capacity of the battery cell, and
   wherein the control unit calculates a full charge/discharge reach time of the battery cell based on the voltage of the battery cell and determines the error of the battery cell based on the full charge/discharge reach time of the battery cell.

10. The battery pack of claim 9, wherein the current measuring unit is configured to measure the current flowing in the battery cell based on a magnetic field generated by the current flowing in the battery cell.

11. The battery pack of claim 10, wherein the battery cell error determining apparatus further comprises a storage unit configured to store a battery capacity at a time of production of the battery cell.

12. The battery pack of claim 11, wherein when a difference between the calculated capacity of the battery cell and the battery capacity at the time of production of the battery cell exceeds a preset threshold, the control unit is configured to determine that the battery cell has a deteriorated capacity.

13. The battery pack of claim 11, further comprising a voltage measurement unit configured to measure a voltage of the battery cell,
   wherein the storage unit is further configured to store a full charge/discharge reach time at the time of production of the battery cell,
   wherein the control unit is configured to calculate a full charge/discharge reach time of the battery cell using the voltage of the battery cell,
   wherein when a difference between calculated full charge/discharge reach time of the battery cell and a full charge/discharge reach time at the time of production of the battery cell exceeds a preset threshold, the control unit is configured to determine that an internal resistance of the battery cell is increased.

14. The battery pack of claim 10, wherein the current measuring unit is configured to measure the current flowing through the battery cell over a first duration, and wherein the control unit is configured to calculate the capacity of the battery cell based on an accumulated amount of current over the first duration.

15. The battery pack of claim 9, wherein the current measurement unit is positioned at any one of a negative electrode or a positive electrode of the battery cell.

16. The battery pack of claim 9, wherein the battery pack is included in an ESS or is a vehicle battery pack.

17. A battery cell error determining method comprising:
measuring a magnetic field generated by a current flowing in a battery cell;
measuring a voltage of the battery cell;
measuring a capacity of the battery cell by accumulating a current derived from the measured magnetic field;
calculating a full charge/discharge reach time of the battery cell based on the voltage of the battery cell;
determining an error of the battery cell based on the measured capacity of the battery cell; and
determining the error of the battery cell based on the full charge/discharge reach time of the battery cell.

18. The method of claim 17, further comprising
determining whether a difference between the calculated full charge/discharge reach time of the battery cell and a predetermined full charge/discharge reach time at the time of production of the battery cell exceeds a first preset threshold; and
determining that an internal resistance of the battery is increased when the difference between the calculated full charge/discharge reach time of the battery cell and the predetermined full charge/discharge reach time at the time of production of the battery cell exceeds the first preset threshold.

19. The method of claim 18, further comprising determining that the capacity of the battery cell is deteriorated when a difference between the measured capacity of the battery cell and a predetermined capacity at a time of production of the battery cell exceeds a second preset threshold.

20. The method of claim 19, further comprising, if it is determined that the internal resistance of the battery is increased or the capacity of the battery cell is deteriorated, transmitting an internal resistance increase signal or a capacity deterioration signal.

* * * * *